(12) United States Patent
Townsend et al.

(10) Patent No.: US 9,197,143 B1
(45) Date of Patent: *Nov. 24, 2015

(54) HARVESTING POWER FROM MULTIPLE ENERGY SOURCES

(75) Inventors: Christopher P. Townsend, Shelburne, VT (US); Steven W. Arms, Shelburne, VT (US); Michael J Hamel, Essex Junction, VT (US)

(73) Assignee: LORD Corporation, Cary, NC (US)

( * ) Notice: Subject to any disclaimer, the term of this patent is extended or adjusted under 35 U.S.C. 154(b) by 1150 days.

This patent is subject to a terminal disclaimer.

(21) Appl. No.: 13/038,339

(22) Filed: Mar. 1, 2011

Related U.S. Application Data

(60) Provisional application No. 61/309,767, filed on Mar. 2, 2010.

(51) Int. Cl.
```
H02N 2/18      (2006.01)
H01L 41/311    (2013.01)
G01L 1/16      (2006.01)
```

(52) U.S. Cl.
CPC ........ *H02N 2/181* (2013.01); *G01L 1/16* (2013.01); *H01L 41/311* (2013.01); *H02N 2/18* (2013.01); *Y10T 307/718* (2015.04)

(58) Field of Classification Search
CPC ............ G01L 1/16; H02N 2/18; H02N 2/181; Y10T 307/718; H01L 41/311; H01L 41/22
USPC .................................................. 307/84, 151
See application file for complete search history.

(56) References Cited

U.S. PATENT DOCUMENTS

| | | | | |
|---|---|---|---|---|
| 5,841,122 A * | 11/1998 | Kirchhoff | .................... | 235/492 |
| 7,227,277 B2 * | 6/2007 | Chapman et al. | ................ | 307/43 |
| 7,781,943 B1 * | 8/2010 | Hamel et al. | ................... | 310/339 |
| 8,035,335 B2 * | 10/2011 | Duron et al. | ................... | 320/101 |
| 2007/0144396 A1 * | 6/2007 | Hamel et al. | ................... | 102/472 |
| 2009/0085409 A1 * | 4/2009 | Kearney-Fischer et al. | .. | 307/115 |
| 2009/0105782 A1 * | 4/2009 | Mickle et al. | ................... | 607/45 |
| 2009/0204179 A1 * | 8/2009 | Dlugos et al. | ................... | 607/61 |
| 2011/0101789 A1 * | 5/2011 | Salter et al. | .................... | 307/104 |
| 2012/0119586 A1 * | 5/2012 | Carralero et al. | .............. | 307/82 |

OTHER PUBLICATIONS

Elie Lefeuvre, David Audigier, Claude Richard, and Daniel Guyomar; Buck-Boost Converter for Sensorless Power Optimization of Piezoelectric Energy Harvester. IEEE Transactions on Power Electronics, vol. 22, No. 5, Sep. 2007, pp. 2018-2025.*

* cited by examiner

*Primary Examiner* — Rexford Barnie
*Assistant Examiner* — Toan Vu
(74) *Attorney, Agent, or Firm* — James M. Leas

(57) ABSTRACT

A device includes a plurality of energy harvesting circuits, an energy storage device, a first diode and a second diode. The plurality of energy harvesting circuits includes a first energy harvesting circuit and a second energy harvesting circuit. The first energy harvesting circuit includes a first transducer and the second energy harvesting circuit includes a second transducer. The first transducer is structured for converting a different kind of energy into electricity than is the second transducer. The first diode is electrically connected between the first energy harvesting circuit and the energy storage device and the second diode is electrically connected between the second energy harvesting circuit and the energy storage device. The first diode is oriented to prevent energy from the second energy harvesting circuit from being dissipated in the first energy harvesting circuit and the second diode is oriented to prevent energy from the first energy harvesting circuit from being dissipated in the second energy harvesting circuit.

23 Claims, 10 Drawing Sheets

CDEH:
CAPACITIVE DISCHARGE ENERGY HARVESTING

Table I. EH-Link Preliminary Specifications and Performance Characteristics.

| | |
|---|---|
| Energy harvester inputs:<br>  Wide range voltage (WRV)<br><br>  Capacitive discharge voltage (CDV)<br>  Ultralow voltage (ULV) | 3–20 VAC or VDC (piezoelectric, electrodynamic, photovoltaic, electromagnetic)<br>20–130 VAC (pulsed piezoelectric)<br>20–600 mVDC (thermoelectric, Peltier, thermopile) |
| Embedded sensing capabilities | triaxial accelerometer, relative humidity and temperature sensor, external single channel differential (Wheatstone bridge) input |
| DC bridge excitation | regulated +2.5 volts DC at 50 mA maximum (pulsed to sensors for sample rates of 100 Hz and below to conserve power) |
| Analog to digital (A/D) converter | successive approximation type, 12 bit resolution |
| Data storage capacity | 2 megabytes (approximately 1,000,000 data points) |
| Data logging sample rates | programmable from 32–2048 samples per second |
| Wireless (TDMA) sample rates | from 1 sample per hour to 20 samples per second, w/ single RF channel |
| sample rate stability | ±25 ppm for sample rates > 1 Hz, ±10% for sample rates ≤ 1 Hz, |
| Radio frequency (RF) transceiver carrier | IEEE 802.15.4, open communication architecture, 2,4 GHz DSSS, license free worldwide (2.405 to 2.480 GHz) – 16 channels |

FIG. 9A

| Range for bi-directional RF Link | 70 m line-of-sight w/ radiated Transmit power level of 0dBm (1mW) |
|---|---|
| Energy consumption levels (microJoules): | |
|     Start up energy: | 12 µJ |
|     Accelerometer: | 105 µJ/measurement |
|     Relative humidity (RH) sensor: | 105 µJ/measurement |
|     Wheatstone bridge: | 168 µJ/measurement |
|     Data transmission: | 12 µJ/packet |
| Operating Temperature | -40 to + 85° C |
| Maximum acceleration limit | 500 g standard (high g option available) |
| Dimensions | 66 by 31 by 14mm^3 |

FIG. 9B

HARVESTING POWER FROM MULTIPLE ENERGY SOURCES

PRIORITY

This application claims the benefit of U.S. Provisional Patent Application 61/309,767, filed Mar. 2, 2010, "Harvesting Power from Multiple Energy Sources," incorporated herein by reference.

RELATED APPLICATIONS

This application is related to the following commonly assigned patent applications:

"System for Remote Powering and Communication with a Network of Addressable, Multichannel Sensing Modules," U.S. Pat. No. 6,529,127 to Christopher Pruyn Townsend et al., filed Jul. 11, 1998, ("the '127 patent");

"Robotic system for powering and interrogating sensors," United States Patent Application 20030234730, to Steven Willard Arms et al., filed Mar. 5, 2003, ("the '730 patent application");

"Remotely powered and remotely interrogated wireless digital sensor telemetry system," U.S. Pat. No. 7,256,695 to Michael John Hamel et al., filed Sep. 23, 2003, ("the '695 patent");

"Energy Harvesting for Wireless Sensor Operation and Data Transmission," U.S. Pat. No. 7,081,693 to M. Hamel et al., filed Mar. 5, 2003 ("the '693 patent");

"Shaft Mounted Energy Harvesting for Wireless Sensor Operation and Data Transmission," U.S. Pat. No. 7,256,505 to S. W. Arms et al., filed Jan. 31, 2004 ("the '505 patent");

"Slotted Beam Piezoelectric Composite," U.S. Provisional Patent Application No. 60/739,976 to D. L. Churchill, filed Nov. 23, 2005, ("the '976 application");

"Energy Harvesting, Wireless Structural Health Monitoring System," U.S. patent application Ser. No. 11/518,777 to S. W. Arms et al., filed Sep. 11, 2006 ("the '777 application");

"Sensor Powered Event Logger," U.S. patent application Ser. No. 11/644,038 to D. L. Churchill et al., filed Dec. 22, 2006 ("the '038 application");

"Integrated Piezoelectric Composite and Support Circuit," U.S. patent application Ser. No. 11/644,334 to D. L. Churchill et al., filed Dec. 22, 2006 ("the '334 application");

"A Capacitive Discharge Energy Harvesting Converter," U.S. patent application Ser. No. 12/009,945 to Michael J. Hamel et al., filed Jan. 23, 2008, ("the '945 application");

"Wideband Vibration Energy Harvester," U.S. patent application Ser. No. 12/011,702 to David L. Churchill et al., filed Jan. 29, 2008 ("the '702 application");

"Wind Turbines and Other Rotating Structures with Instrumented Load Sensor Bolts or Instrumented Load Sensor Blades," U.S. Provisional Patent Application 61/169,309 to David Maass et al., filed Apr. 15, 2009 ("the '309 application"); and "Wireless sensor synchronization methods," U.S. Provisional Patent Application 61/293,948 to Stephen J. DiStasi et al., filed Jan. 11, 2010 ("the '948 application").

All of the above listed patents and patent applications are incorporated herein by reference.

This application is also related to the following papers and data sheets:

"Harvesting Power from Multiple Energy Sources for Wireless Sensors," by Christopher P. Townsend, Michael J. Hamel, and Steven W. Arms, presented at the Fifth Energy Harvesting Workshop and Tutorial at the Roanoke, Va., Mar. 2-4, 2010 incorporated herein by reference.

"Piezoelectric Energy Harvesting Power Supply," LTC3588-1, Linear Technology, incorporated herein by reference.

"Ultralow Voltage Step-Up Converter and Power Manager," LTC3108, Linear Technology, incorporated herein by reference.

"EH Link, 2.4 GHz Energy Harvesting Wireless Node," MicroStrain, Inc., incorporated herein by reference, an earlier version of which was distributed as a flyer at the IMAC XXVIII conference and exposition on structural dynamics, Jacksonville, Fla., on Feb. 2-4, 2010, incorporated herein by reference.

"Energy Harvesting Wireless Sensors for Helicopter Damage Tracking," S. W. Arms et al., American Helicopter Society (AHS) Annual Forum, Phoenix, Ariz., May (2006)

"Tracking Pitch Link Dynamic Loads with Energy Harvesting Wireless Sensors," S. W. Arms, C. P. Townsend, D. L. Churchill, M. Augustin, D. Yeary, P. Darden, N. Phan, AHS 63nd Annual Forum, Virginia Beach, Va., May (2007)

"Scalable, Synchronized, Energy Harvesting Wireless Sensor Networks," S. J. DiStasi, C. P. Townsend, J. H. Galbreath, S. W. Arms, IEEE PHM Conference, Advanced Sensor and Detection Session, Macau, China, Jan. 14th, (2010)

"Strain Energy Harvesting for Wireless Sensor Networks," D. L. Churchill et al., Smart Structures and Materials, SPIE, vol. 5005, pp. 319-327, (2003)

"Synchronized System for Wireless Sensing, RFID, Data Aggregation, & Remote Reporting," S. W. Arms et al., AHS forum 65, Grapevine, Tex., (2009)

"Power Management for Energy Harvesting Wireless Sensors," S. W. Arms et al., Proc. SPIE Int'l Symposium on Smart Structures & Smart Materials, San Diego, Calif., 9 Mar. (2005)

"Multi-channel Structural Health Monitoring Network, Powered & Interrogated Using Electromagnetic Fields," S. W. Arms, M. J. Hamel, C. P. Townsend, Proceedings SAMPE, Baltimore, Md., July (2007)

"A Piezomagnetoelastic Structure for Broadband Vibration Energy Harvesting," Erturk, A., Hoffmann, J., Inman, D. J., Applied Physics Letters 94, 254102 (2009)

FIELD

This patent application generally relates to a system for harvesting energy. More particularly it relates to a system for harvesting energy from multiple kinds of energy sources and/or from power converters that provide different ranges of voltages. Even more particularly it relates to wireless sensor nodes that can harvest energy from multiple kinds of energy sources and/or from power converters that provide different ranges of voltages.

BACKGROUND

Advances in microelectronics have enabled a new generation of scalable sensor networks. Combining sensing, signal conditioning, digital processing, data logging, and wireless digital communications into smaller and smaller integrated circuits allows nodes of these networks to be embedded more and more deeply into machines and structures. But powering such wireless sensor nodes for the long term remains a challenge in many applications, and the more deeply these nodes are embedded, the more challenging it becomes to find ways to maintain a charge on their energy storage elements.

Energy harvesting, or scavenging ambient energies from the operational environment, represents an exciting way to automatically store energy and eliminate battery maintenance. However, in many applications, the source of ambient energy may be intermittent, the kinds of energy that can most easily be harvested may also change with the environmental conditions, and the range of voltages. In addition, the range of voltages provided may vary. Thus, a better solution is needed, and this solution is provided by the present patent application.

SUMMARY

One aspect of the present patent application is a device that includes a plurality of energy harvesting circuits, an energy storage device, a first diode and a second diode. The plurality of energy harvesting circuits includes a first energy harvesting circuit and a second energy harvesting circuit. The first energy harvesting circuit includes a first transducer and the second energy harvesting circuit includes a second transducer. The first transducer is structured for converting a different kind of energy into electricity than is the second transducer. The first diode is electrically connected between the first energy harvesting circuit and the energy storage device and the second diode is electrically connected between the second energy harvesting circuit and the energy storage device. The first diode is oriented to prevent energy from the second energy harvesting circuit from being dissipated in the first energy harvesting circuit and the second diode is oriented to prevent energy from the first energy harvesting circuit from being dissipated in the second energy harvesting circuit.

Another aspect of the present patent application is a device that includes a plurality of energy harvesting circuits, an energy storage device, a first diode and a second diode. The plurality of energy harvesting circuits includes a first energy harvesting circuit and a second energy harvesting circuit. The first energy harvesting circuit harvests energy in a first voltage range and the second energy harvesting circuit harvests energy in a second voltage range. The first voltage range is different from the second voltage range. The first diode is for electrical connection between the first energy harvesting circuit and the energy storage device. The second diode is for electrical connection between the second energy harvesting circuit and the energy storage device. The first diode is oriented to prevent energy from the second energy harvesting circuit from being dissipated in the first energy harvesting circuit and the second diode is oriented to prevent energy from the first energy harvesting circuit from being dissipated in the second energy harvesting circuit.

Another aspect of the present patent application is a device that includes a plurality of energy harvesting circuits, an energy storage device, a voltage dependent switch, and a load. Each of the plurality of energy harvesting circuits includes a transducer for converting a kind of energy into electricity. Each of the plurality of energy harvesting circuits is connected to charge the energy storage device when its kind of energy is provided. The voltage dependent switch is connected between the energy storage device and the load. The voltage dependent switch closes when voltage across the voltage dependant switch reaches a first threshold. Current flows to power the load when the voltage across the voltage dependant switch reaches the first threshold.

Another aspect of the present patent application is a device that includes a plurality of energy harvesting circuits all connected for powering the same load, including a first energy harvesting circuit, a second energy harvesting circuit, and a third energy harvesting circuit. The first energy harvesting circuit includes a first transducer, the second energy harvesting circuit includes a second transducer, and the third energy harvesting circuit includes a third transducer. The first transducer and the second transducer both provide AC current and the third transducer provides DC current. The first transducer has a substantially higher impedance than the second transducer.

Another aspect of the present patent application is a device for powering a load that includes an energy harvesting circuit, a voltage dependent switch, an energy storage device, a first connection to the load, and a second connection to the load. The energy harvesting circuit includes a transducer for converting a kind of energy into electricity. The first connection to the load connects the energy harvesting circuit to power the load. The voltage dependent switch is connected between the energy harvesting circuit and the energy storage device. The second connection to the load connects the energy storage device to power the load. The second connection to the load includes a diode oriented to allow current from the energy storage device to flow to the load.

BRIEF DESCRIPTION OF THE DRAWINGS

FIGS. 9a-9b is a table of preliminary specifications and performance characteristics of an EH-Link™ integrated sensing, processing, wireless communications, and energy conversion and energy storage microelectronics module.

DETAILED DESCRIPTION

Figure 1:
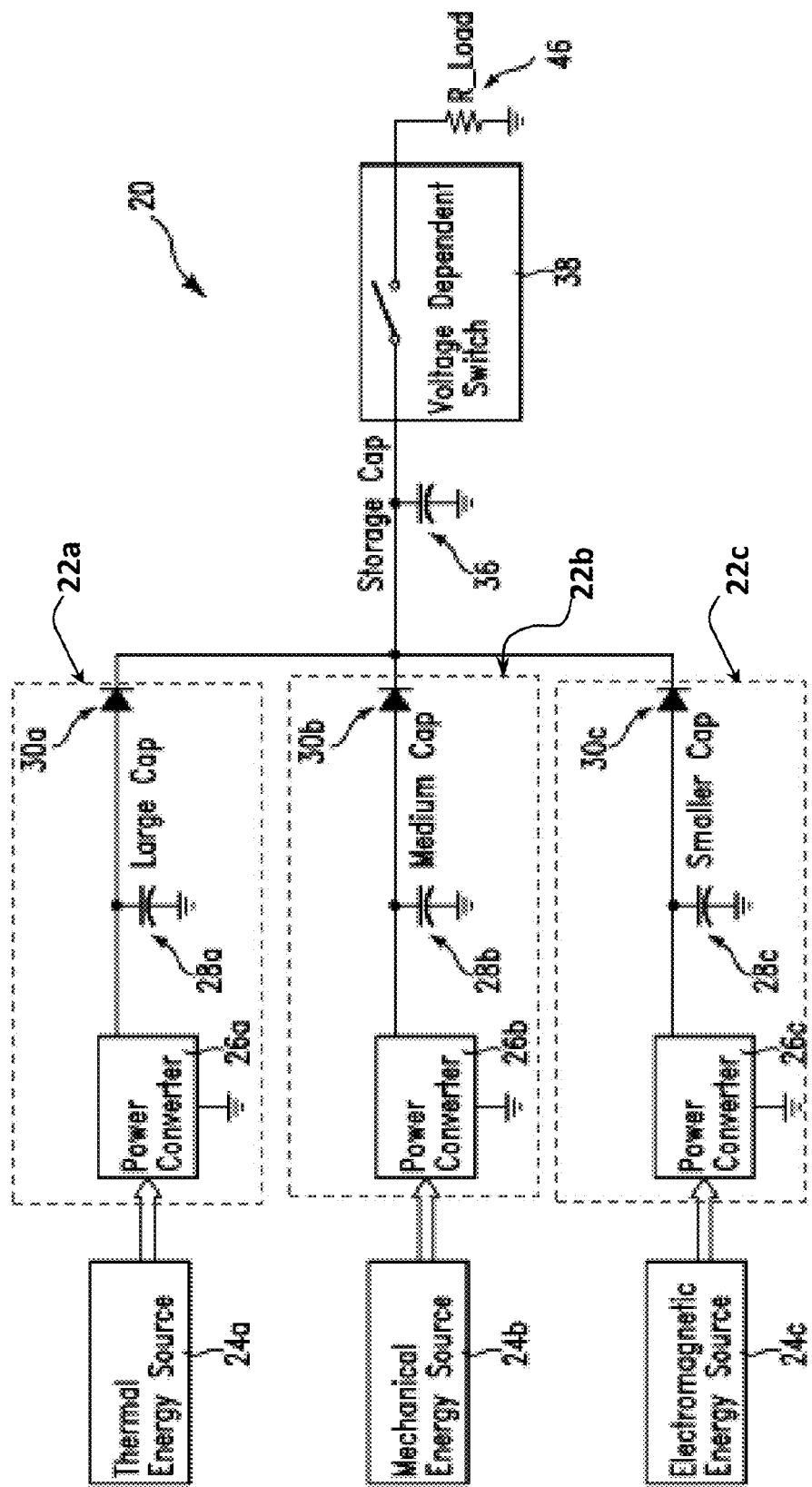
FIG. 1 is a block diagram of a device capable of harvesting energy from several different kinds of energy sources, storing the electricity so generated, and providing the electricity to a load.

The present applicants designed a device that allows energy harvesting from multiple sources of energy. In the embodiment shown in FIG. 1 device 20 includes three energy harvesting circuits 22a, 22b, 22c connected to harvest energy from three different kinds of energy sources, 24a, 24b, 24c. The three kinds of energy sources illustrated in FIG. 1 include thermal energy source 24a, mechanical energy source 24b, and electrodynamic energy source 24c. These different kinds of energy sources in this example include heat, strain, vibration, reciprocating motion, circular motion, a radio source, and a light source.

Each energy harvesting circuit 22a, 22b, 22c includes a different kind of power converter 26a, 26b, 26c. Each power converter 26a, 26b, 26c includes a transducer for converting energy from the corresponding energy source 24a, 24b, 24c into electrical energy. Each power converter 26a, 26b, 26c can also include a circuit for conditioning the electrical energy for use in a load.

Energy harvesting circuits 22a, 22b, 22c also includes corresponding capacitor 28a, 28b, 28c for storing the harvested electrical energy. Energy harvesting circuits 22a, 22b, 22c each also includes corresponding diode 30a, 30b, 30c oriented for preventing power generated in one energy harvesting circuit from being dissipated in another energy harvesting circuit.

In one embodiment device 20 also includes energy storage device 36. Each of energy harvesting circuits 22a, 22b, 22c is connected to energy storage device 36 through its corresponding diode 30a, 30b, 30c. Thus, energy storage device 36 can accumulate charge from any or all of energy harvesting circuits 22a, 22b, 22c.

In one embodiment, energy storage device 36 can include a capacitor and/or a battery. The capacitor can be a super capacitor. The battery can be rechargeable. The battery can be a thin film battery.

In this embodiment, device 20 also includes voltage dependent switch 38 that has a first voltage threshold and a second voltage threshold. The first voltage threshold is higher than the second voltage threshold. Voltage dependent switch 38 closes when a voltage applied across the switch as a result of charging of energy storage device 36 is equal to or greater than the first voltage threshold. Voltage dependent switch 38 opens when a voltage applied across the switch as a result of discharging energy storage device 36 is equal to or less than the second voltage threshold. For example, the first threshold can be 5.1 V and the second threshold can be 2.2 V. In this embodiment voltage dependent switch 38 is connected to the positive lead of load 46. An LTC1540 can be used for voltage dependent switch 38.

In this embodiment, when voltage dependent switch 38 is closed current can flow from storage device 36 to load 46. When voltage dependent switch 38 is open no current can flow from storage device 36 to load 46 and storage device can accumulate charge from any of the energy harvesting circuits 22a, 22b, 22c. Thus, load 46 can operate when voltage across energy storage device 36 reaches the first voltage threshold and load 46 can continue to operate until it uses enough of that charge so voltage across energy storage device 36 declines to the second voltage threshold.

In one embodiment one kind of energy source 24b includes mechanical energy. The mechanical energy can be, for example, strain energy, vibration energy, a transient mechanical event, such as an impact, or rotational energy. A device, such as a piezoelectric device, or, for rotational motion, a generator, can convert such mechanical energy into electrical energy.

In the embodiment in which one kind of energy source 24a includes thermal energy, a device that harvests energy from a difference in temperature can be used, such as a solid state thermoelectric generator. The solid state thermoelectric generator can be a Peltier thermoelectric generator or a thermopile, either of which converts thermal energy to electricity.

Another kind of energy source includes energy from light, and a device, such as a solar cell, can be used to convert the light energy into electricity.

In an embodiment in which one kind of energy source includes energy from an electromagnetic field, a device, such as a coil or an antenna can be connected to harvest the electromagnetic energy and convert it into electricity. A rectifier can be included to provide direct current.

Device 20 also allows energy harvesting with power converting devices that provide different voltage ranges. In this case, the kind of energy supplying the different voltage ranges can be different, as shown in FIG. 1 in which at least two of the voltage ranges so supplied are different from each other. A voltage adjusting circuit may be included in some or all of power converting circuits 26a, 26b, 26c to provide a voltage that can be efficiently stored in energy storage device 36.

A single energy source can be harvested with different transducers that provide different voltage ranges. For example transducers such as solar panels and piezoelectric devices can be configured with different numbers in series to provide different voltage ranges. In another example, different magnitudes of mechanical energy can be harvested by different devices, such as a piezoelectric device mounted on a vibrating beam and an electrodynamic generator mounted on a reciprocating or rotating device, that provide different voltage ranges.

In an example with three voltage ranges, the voltage ranges may be 20 mV to 600 mV, 3V to 20V, and 20V to 130V. Device 20 can include additional energy harvesting circuits that harvest in additional voltage ranges.

In one embodiment, device 20 has different energy harvesting circuits at least one of which is capable of accepting energy from a transducer that produces alternating current and at least another of which is capable of accepting energy from a transducer that produces direct current. Another energy harvesting circuit in device 20 may be capable of accepting energy from a transducer, such as a piezoelectric device that produces a pulse of electricity in response to a transient event, such as a collision, an impact, the closing of a door, a footfall, or the firing of a weapon. These energy harvesting circuits may include a power conditioning circuit that converts signals from the transducer to a signal that is useful to the load, for example typically 3V DC.

In one example, load 46 includes one or more of the following: a sensor, signal conditioning circuit, a processor, a memory, a timekeeper, a wireless communications device, a light, and an actuator, such as a motor.

On-board sensors can include a triaxial accelerometer, a relative humidity sensor, a temperature sensor, and Wheatstone bridge type sensors, such as strain gauges, pressure transducers, load cells, etc.

Figure 2:
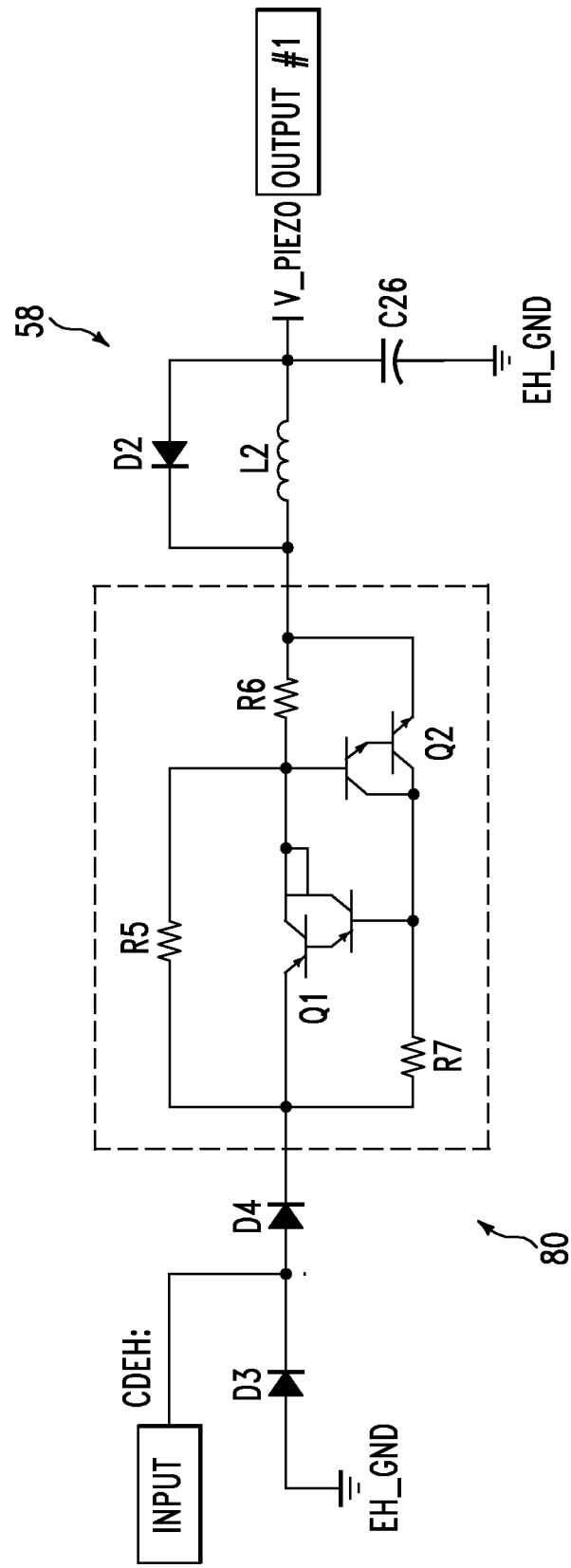
FIG. 2 is a schematic diagram of a circuit for receiving power from an energy harvesting transducer in the range from 20V to 130V and providing a stepped down voltage.

An energy harvesting circuit that efficiently harvests energy from a piezoelectric that provides a voltage in the range of 20 Volts to 130 Volts is described in the '945 application, incorporated herein by reference and shown in FIG. 2 as circuit 58 in the schematic under the heading Capacitive Discharge Energy Harvesting (CDEH) circuit. Such a circuit may also harvest energy in a voltage range higher than 130 Volts while efficiently providing an output at a substantially lower voltage.

Figure 3:
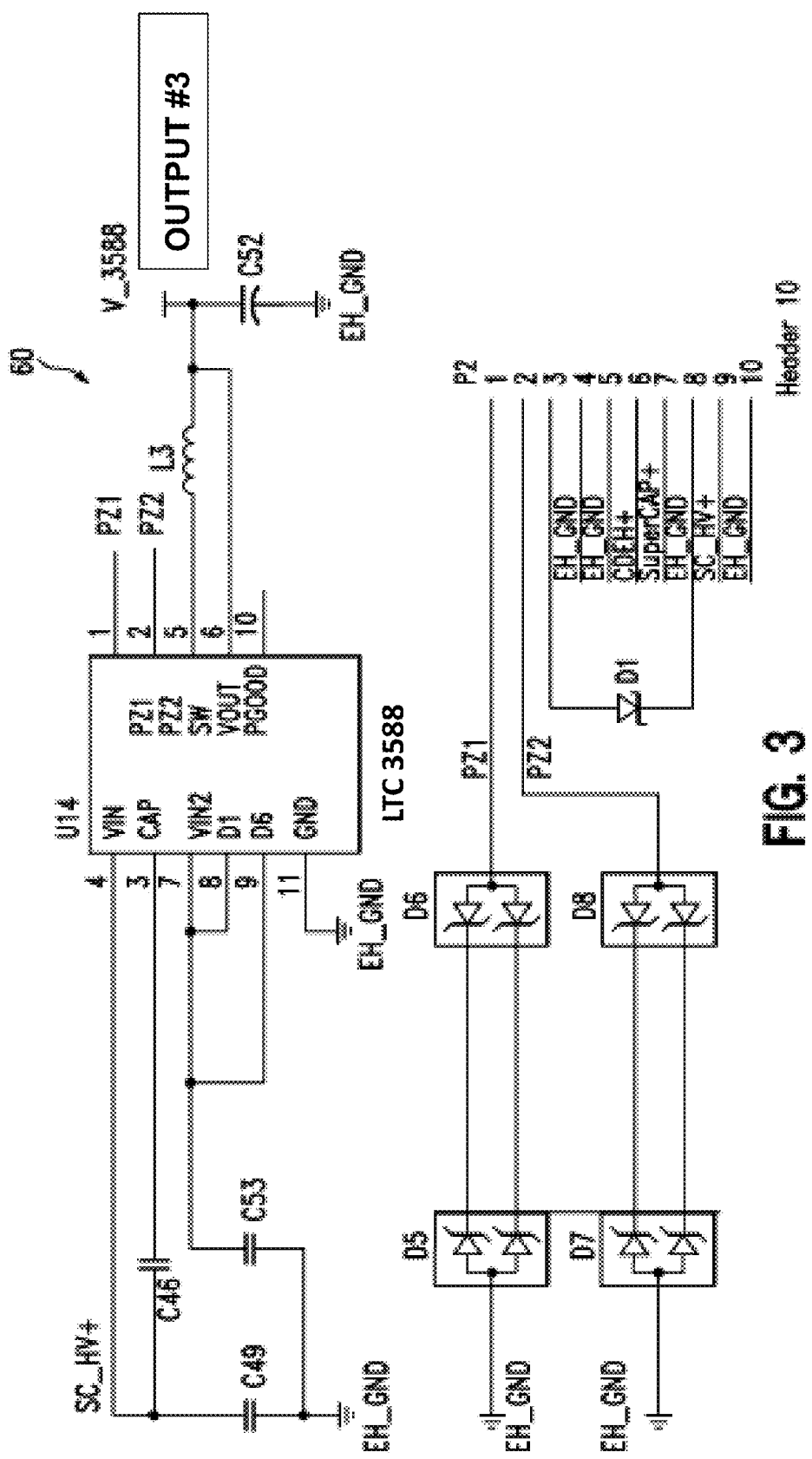
FIG. 3 is a schematic diagram of a circuit for receiving power from an energy harvesting transducer in the range from 3V to 20V.

An energy harvesting circuit that harvests energy from a piezoelectric transducer that provides a voltage in the range of 2.7 Volts to 20 Volts is described in the LTC3588-1 data sheet, incorporated herein by reference. Circuit 60, similar to the circuit shown in the LTC3588-1 data sheet, is shown in FIG. 3 under the heading Wide Range Voltage, and circuit 60 provides an output of 3.6 Volts. Extra circuit over-voltage protection has been added with zener diodes D5-D8 that limits the voltage from the input transducer. In addition to a piezoelectric transducer other types of transducers, including an electro-dynamic transducer, such as a rotating coil or rotating magnet type generator, can be used with circuit 60.

Figure 4:
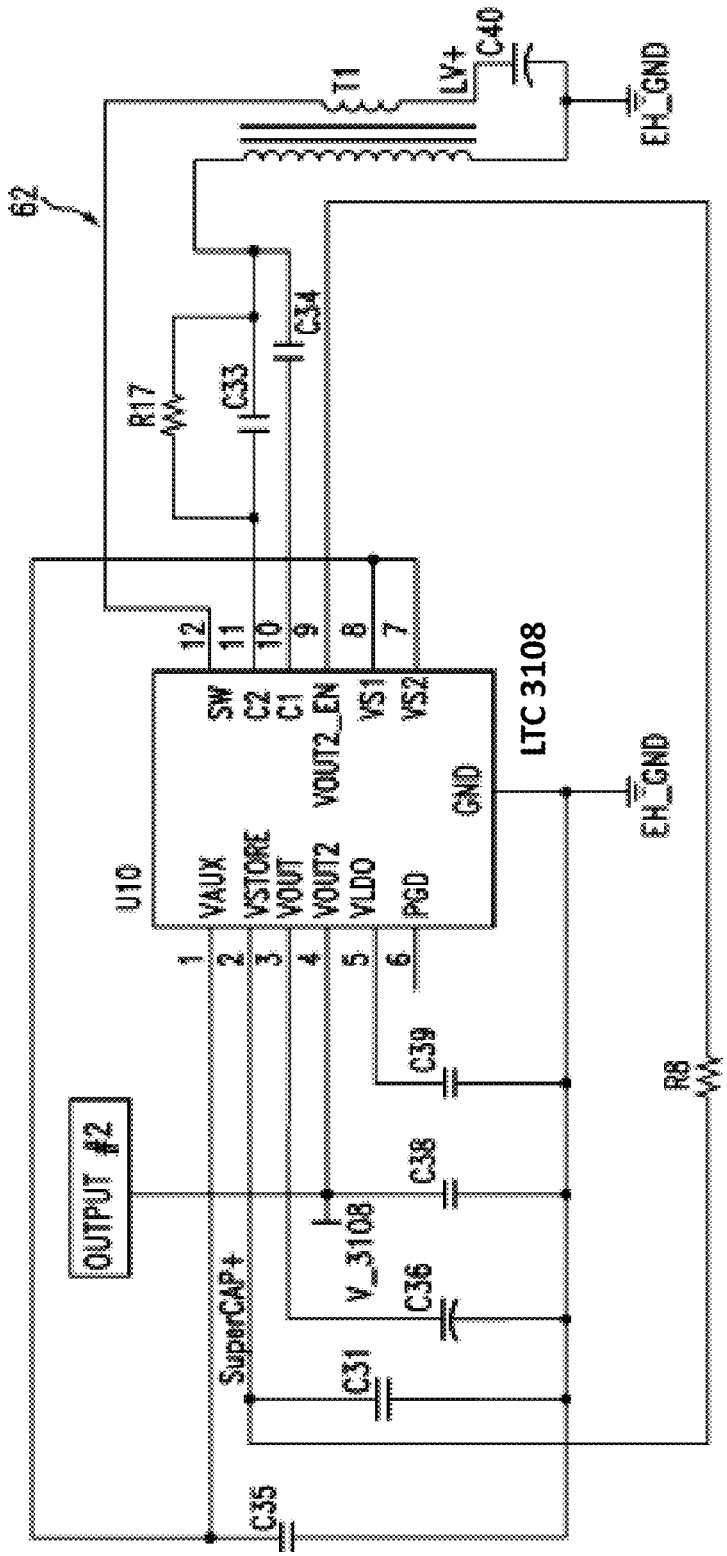
FIG. 4 is a schematic diagram of a circuit for receiving power from an energy harvesting transducer in the range from 20 mV to 600 mV and providing a stepped up voltage.

An energy harvesting circuit that harvests energy from a low voltage source, such as one that provides a voltage in the range from 20 mV to 600 mV is described in the LTC3108 data sheet, incorporated herein by reference, and shown in the schematic of FIG. 4 as circuit 62 under the heading Ultra-Low Voltage Step Up Converter. Circuit 62 provides an output of 3.6 volts.

Figure 5:
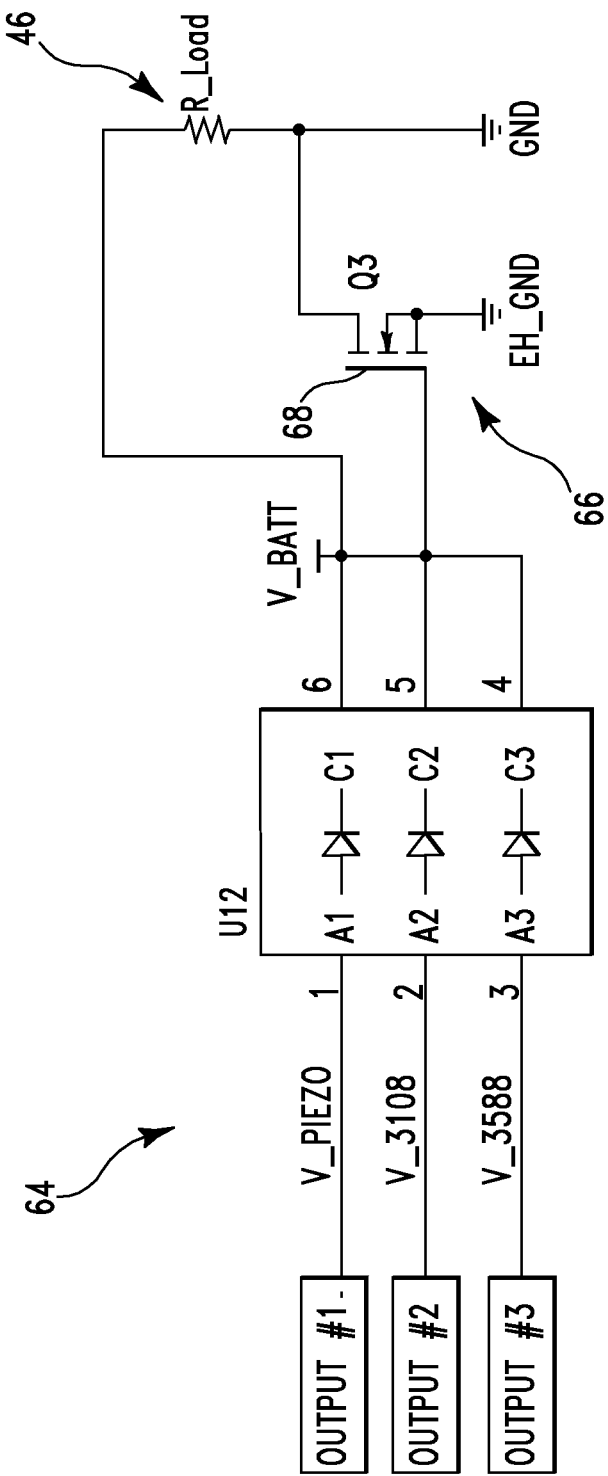
FIG. 5 is a schematic diagram of a circuit for combining outputs of the circuits of FIGS. 2-4.

The present applicants recognized that inputs from two or more of these energy harvesting circuits from different sources and/or with different voltage ranges could be applied simultaneously to a circuit that uses the energy, as shown in FIG. 1 or in another embodiment, circuit 64 in the schematic of FIG. 5 under the heading nA Switch Circuit.

In the embodiment of FIG. 5, energy storage device 36 is eliminated and voltage dependent switch 38 that has two threshold voltages has been replaced with voltage dependent switch 66 that has only one threshold voltage. In the embodiment of FIG. 5, voltage dependent switch 66 is connected to the load as a low side switch. Voltage dependent switch 66 turns on when about 2 volts is applied between gate 68 and EH_GND. When this voltage is available from one or more of the energy harvesting circuits, voltage dependent switch 66 turns on, and load ground is connected to EH_GND, completing the circuit and allowing current to flow in load 46. When this voltage is not available from one of the energy harvesting circuits, voltage dependent switch 66 is off, load ground is disconnected from EH_GND, preventing current from flowing in load 46.

Figure 6:
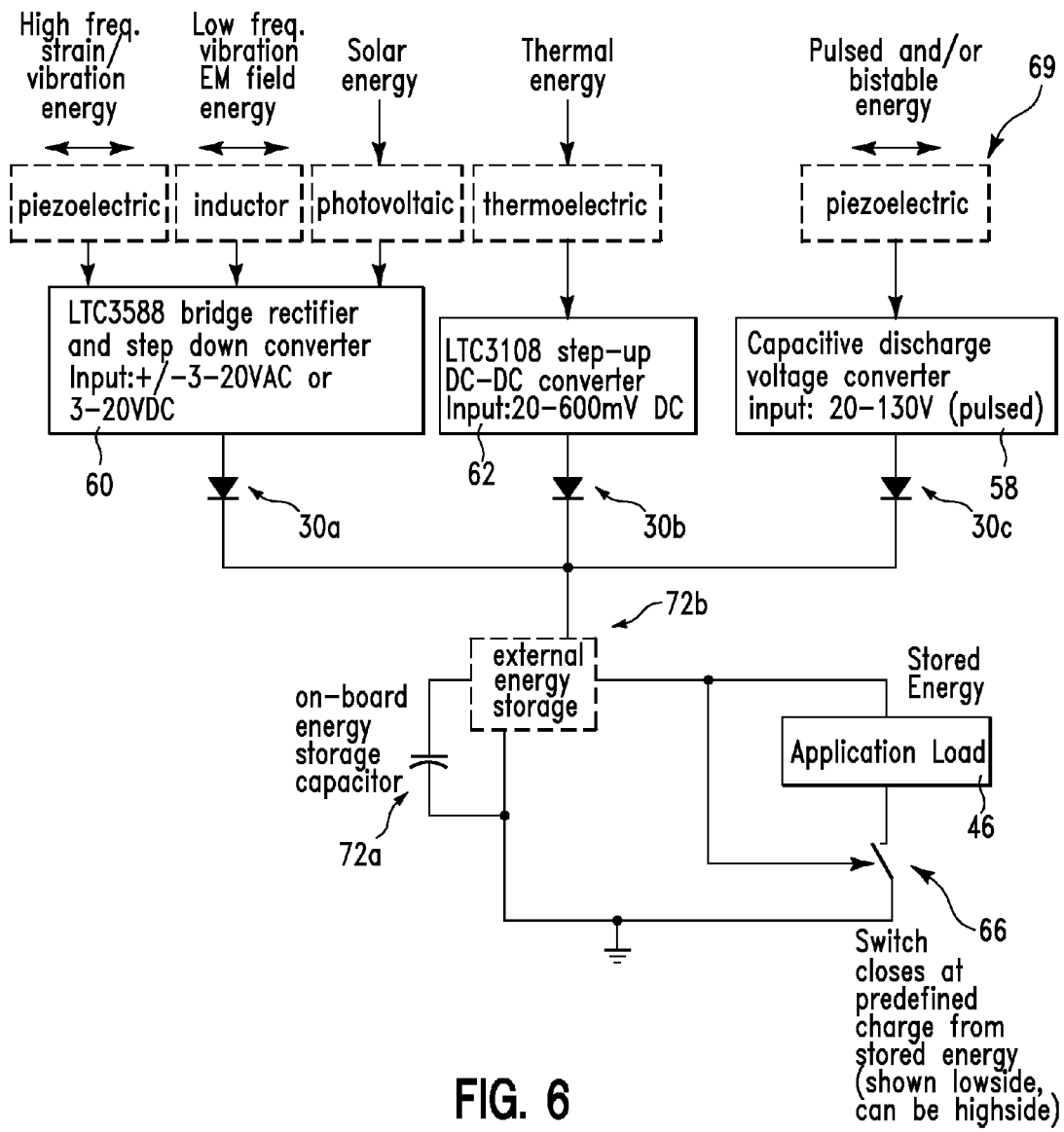
FIG. 6 is a block diagram of the circuit of FIG. 5.

As shown in FIGS. 5-6, energy from multiple sources, such as strain, vibration, induction, sun light, thermal energy, a pulse source, and/or a bistable source, is collected and converted into electricity by a respective transducer 66, such as a piezoelectric, an inductive, a photovoltaic, and a thermoelectric. The electricity is then processed in respective power conditioning circuit such as circuit 58, 60, and 62, the three types shown in the schematics of FIGS. 2-4. This processing may include stepping up or stepping down the voltage, as shown for the piezoelectric circuit and the ultra-low voltage step up converter.

The output of each of the three energy harvesting circuits is provided through its own diode 30a, 30b, 30c. The outputs of the diodes may all be connected for storing charge in one or more electrical storage devices, such as on-board capacitor 72a or external battery 72b. Diodes 30a, 30b, 30c for each energy harvesting circuit prevent charge from flowing from one energy harvesting circuit to another that may not be functioning to provide any voltage or as much voltage at a particular time.

Voltage dependent switch 66, shown in the block diagrams of FIGS. 5 and 6, monitors the voltage across electrical storage device 72a, 72b as described in the '693 patent, incorporated herein by reference.

In another embodiment an additional voltage dependent switch 80 is also included in at least one of the energy harvesting circuits, as shown in FIG. 2 and described for a single energy harvesting circuit in the '693 application, incorporated herein by reference. In this embodiment, the output of voltage dependent switch 80, that may be included in its own energy harvesting circuit goes to its own diode, such as diode 30b, combined with diode protected outputs from other energy harvesting circuits, and provided to energy storage device 36, then to another voltage dependent switch 38, and then to load 46, as shown in FIG. 1. Alternatively, the output of voltage dependent switch 80, that may be included in its own energy harvesting circuit goes to its own diode, such as diode 30b, combined with diode protected outputs from other energy harvesting circuits, and provided both to another voltage dependent switch 38, and to load 46, as shown in FIG. 5.

The present applicants have also provided ways to enable operation of the load after only a small amount of charge has been stored and before a large storage device has been fully charged. One such scheme has different sized capacitors for each of the different energy harvesting circuits before its respective diode, as shown in the block diagram of FIG. 1. In this embodiment, smaller capacitor 28c, associated for example with electromagnetic energy source 24c may charge to a sufficiently high voltage to cause voltage dependent switch 38 to close well before either of the other energy harvesting circuits 22a, 22b have sufficiently charged their respective capacitors 28a, 28b. Thus, load 46, which may include a sensor, a microprocessor, and a data logging device, can start taking data while charge is building up in medium capacitor 28b and large capacitor 28a. Of course, if another type of energy is more available, those larger capacitors may charge up faster than the smaller. In another embodiment, capacitors 28a, 28b, 28c can be omitted from energy harvesting circuits 22a, 22b, 22c.

Figure 7:
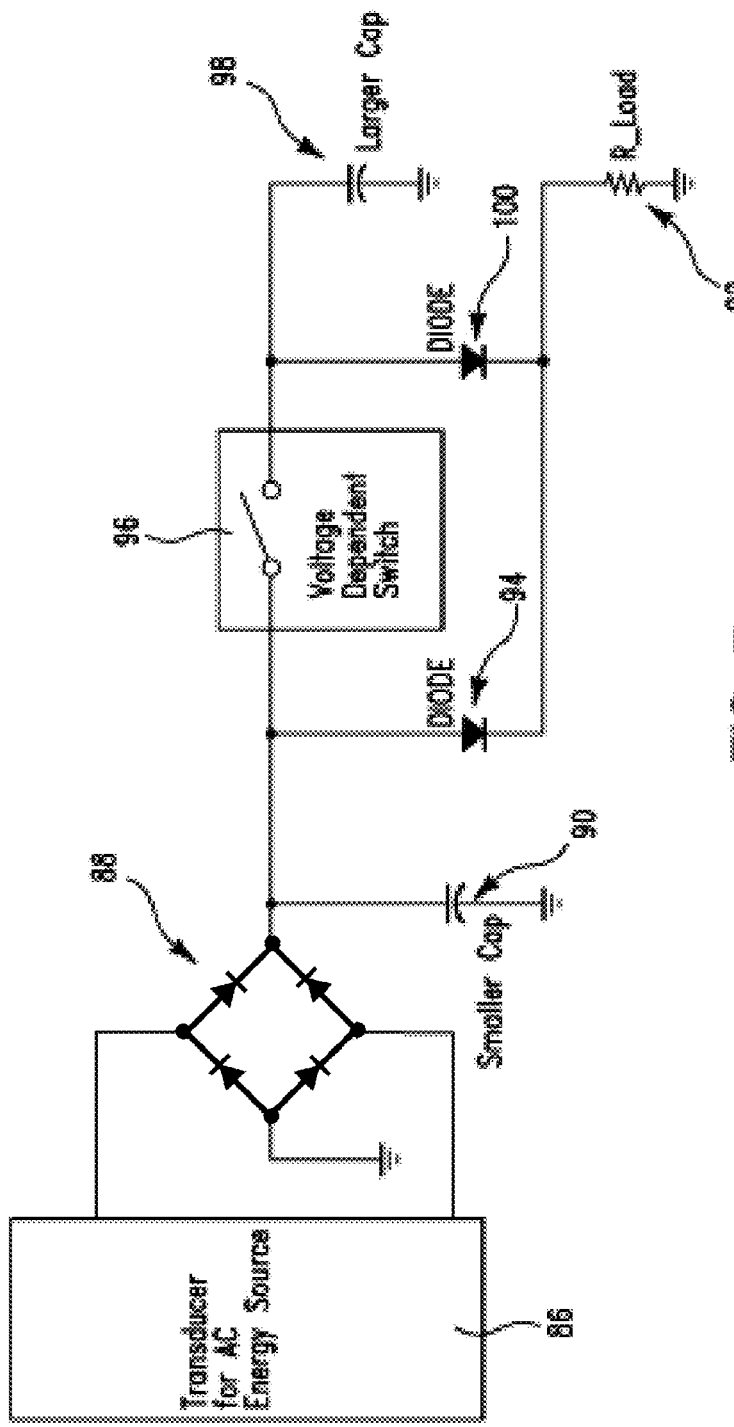
FIG. 7 is a block diagram of a circuit that provides two pathways between an energy harvesting circuit and a load, the first a direct connection for immediate powering when the energy harvesting circuit is producing electricity, the second including an energy storage device for powering the load when the energy harvesting device is not providing sufficient electricity.

In another embodiment, an energy source such as an electromagnetic energy source, provides a kind of energy for which transducer 86, such as a coil, provides an alternating current which is rectified in full bridge rectifier 88 to charge smaller capacitor 90 and to immediately provide direct current to load 92 through diode 94, as shown in FIG. 7. A source of energy for which a transducer produces direct current or a pulse can also be used. When a sufficiently large amount of current is being generated by transducer 86 and provided to load 92, the voltage across capacitor 90 rises sufficiently to cause voltage dependent switch 96 to close, allowing some of the electricity generated by transducer 86 to flow to charge a larger energy storage device, such as capacitor 98. Voltage dependent switch 96 may open and close multiple times while charge is transferred from transducer 86 and smaller capacitor 90 to larger capacitor 98 through voltage dependent switch 96. Charge stored in larger capacitor 98 can maintain current to load 92 through diode 100 to operate load 92 even if the AC energy source temporarily stops providing energy and smaller capacitor 90 is discharged.

Diode 94 prevents charge from transferring from larger capacitor 98 back to smaller capacitor 90, thus, retaining charge on larger capacitor 98. Second diode 100 prevents charge from transferring from smaller capacitor 90 to larger capacitor 98 unless voltage dependent switch 96 is closed.

Figure 8:
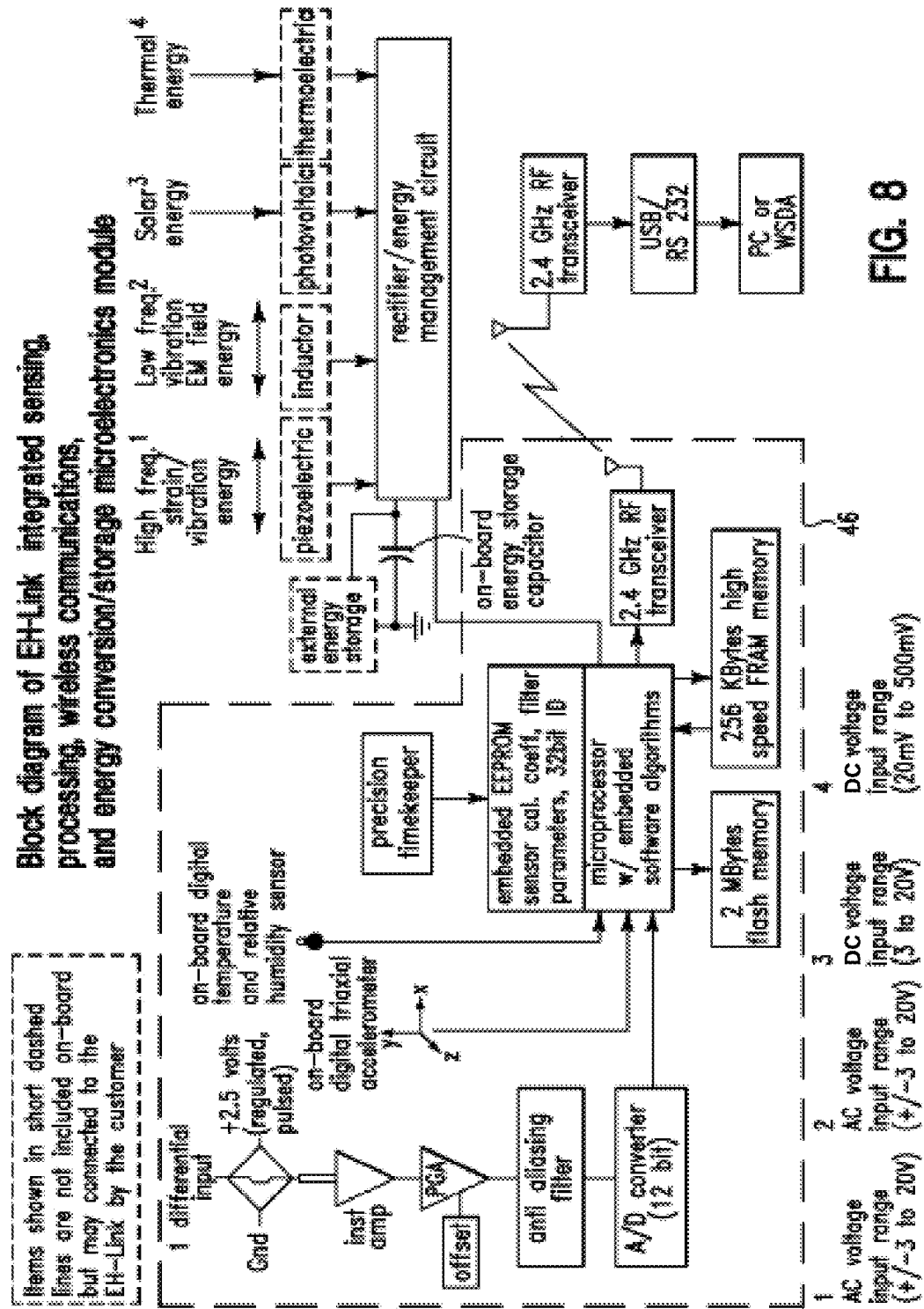
FIG. 8 is a block diagram of an EH-Link™ integrated sensing, processing, data storage, wireless communications, energy conversion, and energy storage microelectronics module that includes provision for measuring humidity, temperature, a variety of sensors and a precision time keeper.

One embodiment, built and tested by the present applicants, is called EH-Link, a block diagram of which is shown in FIG. 8. The EH-Link wireless node is a self powered sensor, capable of harvesting energy from multiple ambient energy sources, and is compatible with a range of harvester types, including piezoelectric, electrodynamic generators, and thermoelectric generators. EH-Link includes low voltage conversion electronics to facilitate energy harvesting from energy sources whose transducers provide cyclic alternating current (AC) as well as energy sources whose transducers provide direct current (DC). The EH-Link uses recently introduced integrated energy conversion electronics (models LTC3588 & LTC3108) from Linear Technology Corporation (Milpitas, Calif.). The LTC3588 integrates a low loss full wave bridge rectifier with a high efficiency buck converter to form an energy harvesting circuit optimized for high output impedance energy sources, such as piezoelectric transducers. The LTC3108 integrates a highly efficient step up DC voltage converter optimized for low voltage output, low impedance energy sources such as thermopiles, thin film thermoelectric devices, Peltier devices, and photovoltaic elements. The EH-Link uses circuitry as described herein above that enables the end user to attach multiple types of energy harvesters without conflict. EH-Link also supports multiple types of energy storage elements, including super capacitors and thin film batteries.

Embedded energy conversion and energy conservation methods allow the EH-Link to operate from extremely low power levels, which enables it to be used in environments where only low level ambient energy sources are available for harvesting.

The EH-Link operates within the IEEE 802.15.4 standard for low power wireless communications, and can operate as a data logger or as a periodic transmitter as part of a time division multiple access (TDMA) and carrier sense multiple access (CSMA) enabled wireless network. Each EH-Link node in such a wireless network is assigned a unique 16 bit address or an optional 96 bit Electronic Product Code for self-powered active sensor-RFID applications.

In applications with vibrating machinery or structures under load, EH-Link can be self-powered from a tiny generator, such as a piezoelectric converter. EH-Link includes a wide range voltage (WRV) input, as shown in FIG. 3, that will support both high voltage high impedance AC, low voltage, low impedance AC, and DC type energy harvesters, over a wide input voltage range of 3 to 20 VAC as well as 3 to 20 VDC. The LTC3588 in the WRV has a built-in circuitry to protect the EH-Link from over voltages that exceed 20 volts. The WRV input takes advantage of the LTC3588's highly efficient step down converter, which maintains over 85% power conversion efficiency at microamp input currents (high impedance). The WRV input can be used with both piezoelectric and inductive type vibration energy harvesters, and with relatively large solar panels in high ambient light conditions.

A capacitive discharge Energy Harvesting (CDEH) input, as shown in FIG. 2, supports high voltage, high impedance energy sources such as hard ceramic piezoelectric elements subject to an impact as well as bi-stable piezoelectric energy harvester, as described in the '945 application and in a paper, "A Piezomagnetoelastic Structure for Broadband Vibration Energy Harvesting," by A. Erturk, J. Hoffmann, and D. J. Inman, Applied Physics Letters 94, 254102 (2009), incorporated herein by reference. The CDEH input converts relatively high voltage pulses at hardware programmable voltage thresholds from 20-130V to lower level voltages at higher current to enable efficient energy storage.

In addition to the WRV and CDV inputs, EH-Link also supports an ultralow voltage (ULV) input, as shown in FIG. 4. The ULV input of the EH-Link can be powered from Peltier thermoelectric generators, or thermopiles, operating over an input voltage range of only 20 mV DC to 600 mV DC. This capability enables the node to operate from temperature differentials below 5° C. with thermoelectric generators. It can also operate in ambient light levels well below that required for solar cell use with traditional electronics, due to the ultralow voltage step-up power converter.

Each of these three inputs (WRV, CDV, and ULV) are diode shared at the input of the voltage sensitive switch, as shown in FIG. 1, such that any or all sources can contribute to powering the energy storage elements without energy from one being dissipated in another. A table of preliminary performance characteristics is provided in Table I in FIGS. 9a-9b.

What is claimed is:

1. A device, comprising:
   a plurality of energy harvesting circuits all connected for powering a load, the load being the same load, a voltage dependent switch positioned between said plurality of energy harvesting circuits and said load, said plurality of energy harvesting circuits including:
   a first energy harvesting circuit,
   a second energy harvesting circuit, and
   a third energy harvesting circuit,
   wherein said first energy harvesting circuit includes a first transducer,
   wherein said second energy harvesting circuit includes a second transducer, and
   wherein said third energy harvesting circuit includes a third transducer,
   wherein said first transducer and said second transducer both provide AC current and wherein said third transducer provides DC current,
   wherein said first transducer has a substantially higher impedance than said second transducer, and
   a plurality of diodes, wherein a diode is located between each of said plurality of energy harvesting circuits and said voltage dependent switch.

2. A device as recited in claim 1, wherein said first transducer is for converting into electricity one from the group consisting of mechanical energy, thermal energy, light energy, and energy from an electromagnetic field.

3. A device as recited in claim 2, wherein said mechanical energy includes at least one from the group consisting of strain energy, vibration energy, and rotational energy.

4. A device as recited in claim 2, wherein said mechanical energy includes energy from a transient mechanical event.

5. A device as recited in claim 2, wherein said first energy harvesting circuit harvests thermal energy from a difference in temperature.

6. A device as recited in claim 5, wherein said first energy harvesting circuit harvests energy from a difference in temperature using at least one from the group consisting of a Peltier thermoelectric generator and a thermopile.

7. A device as recited in claim 1, wherein said first transducer provides alternating current and wherein said second transducer provides direct current.

8. A device as recited in claim 1, wherein said first transducer provides a pulse of electricity.

9. A device as recited in claim 1, further comprising an energy storage device, said energy storage device includes at least one from the group consisting of a super capacitor, a rechargeable battery, and a thin film battery.

10. A device as recited in claim 9, wherein said load is connected for receiving electrical energy derived from said energy storage device, wherein said load includes at least one from the group consisting of a sensor, a processor, a memory, a timekeeper, a wireless communications device, a light, and an actuator.

11. A device as recited in claim 10, wherein said load includes a power conditioning circuit, said processor, a data logging circuit, and said wireless communications circuit, wherein said signal conditioning circuit, said processor, said data logging circuit, and said wireless communications circuit receive all their electrical energy derived from at least one of said plurality of energy harvesting devices.

12. A device as recited in claim 1, further comprising a third energy harvesting circuit and a third diode, wherein said third energy harvesting circuit includes a third transducer that is structured to convert a different kind of energy into electricity than said first transducer and than said second transducer, wherein said third diode is connected between said third energy harvesting circuit and said energy storage device, and wherein said third diode is oriented to prevent energy from at least one from the group consisting of said first energy harvesting circuit and said second energy harvesting circuit from being dissipated in said third energy harvesting circuit.

13. A device as recited in claim 1, wherein said voltage dependent switch has a first voltage threshold and a second voltage threshold, wherein said first voltage threshold is higher than said second voltage threshold, wherein said voltage dependent switch closes when a voltage applied across the voltage dependent switch is equal to or greater than the first voltage threshold and said voltage dependent switch opens when a voltage applied across the switch is equal to or less than the second voltage threshold.

14. A device as recited in claim 13, wherein said load is connected for receiving electrical current passing through said voltage dependent switch.

15. A device as recited in claim 1, wherein said first energy harvesting circuit harvests energy in a first voltage range and wherein said second energy harvesting circuit harvests energy in a second voltage range, wherein said first voltage range is different from said second voltage range.

16. A device as recited in claim 15, wherein said first voltage range is 20 to 600 mV.

17. A device as recited in claim 15, wherein said first voltage range is from 3V to 20V.

18. A device as recited in claim 15, wherein said first voltage range is from 20V to 130V.

19. A device as recited in claim 1, wherein at least one of said energy harvesting circuits includes a circuit for one from group consisting of stepping up voltage and for stepping down voltage.

20. A device as recited in claim 1, wherein said plurality of diodes include one said diode located within each of said plurality of energy harvesting circuits, wherein one said diodes is positioned to communicate with said energy storing device, wherein each of said plurality of diodes is oriented to prevent current generated in one of said plurality of energy harvesting circuits from being dissipated in another of said energy harvesting circuits.

21. A device as recited in claim 20, further comprising:
a plurality of capacitances, wherein said plurality of capacitances includes a first capacitance and a second capacitance,
a plurality of power converters, wherein said plurality of power converters includes a first power converter and a second power converter,
wherein said plurality of diodes includes a first diode and a second diode,
wherein said first energy harvesting circuit includes said first capacitance, said first power converter and said first diode, said first capacitance is connected between said first power converter and said first diode, and
wherein said second energy harvesting circuit includes said second capacitance, said first second converter and said second diode, said second capacitance is connected between said second power converter and said second diode.

22. A device as recited in claim 21, wherein first capacitance is larger than said second capacitance.

23. A device for powering a load, comprising an energy harvesting circuit, a voltage dependent switch, an energy storage device, a first connection to the load, and a second connection to the load, wherein said energy harvesting circuit includes a transducer for converting a kind of energy into electricity, wherein said first connection to the load connects said energy harvesting circuit to power the load, wherein said voltage dependent switch is connected between said energy harvesting circuit and said energy storage device, wherein said second connection to the load connects said energy storage device to power the load, wherein said second connection to the load includes a diode oriented to allow current from said energy storage device to flow to said load.

* * * * *